(12) United States Patent
Doi et al.

(10) Patent No.: US 10,508,637 B2
(45) Date of Patent: Dec. 17, 2019

(54) IGNITION CONTROL SYSTEM

(71) Applicant: DENSO CORPORATION, Kariya, Aichi-pref. (JP)

(72) Inventors: Kaori Doi, Kariya (JP); Akimitsu Sugiura, Kariya (JP); Fumiaki Aoki, Nishio (JP); Noriaki Nishio, Nishio (JP); Yuki Murayama, Kariya (JP)

(73) Assignee: DENSO CORPORATION, Kariya (JP)

( * ) Notice: Subject to any disclaimer, the term of this patent is extended or adjusted under 35 U.S.C. 154(b) by 1 day.

(21) Appl. No.: 15/668,791

(22) Filed: Aug. 4, 2017

(65) Prior Publication Data

US 2018/0038335 A1 Feb. 8, 2018

(30) Foreign Application Priority Data

Aug. 4, 2016 (JP) ................. 2016-153420

(51) Int. Cl.
| | |
|---|---|
| *F02P 3/05* | (2006.01) |
| *F02P 3/04* | (2006.01) |
| *F02D 41/22* | (2006.01) |
| *F02P 15/08* | (2006.01) |
| *G01R 19/165* | (2006.01) |

(Continued)

(52) U.S. Cl.
CPC ............ *F02P 3/05* (2013.01); *F02P 3/0435* (2013.01); *F02D 2009/0277* (2013.01); *F02D 2041/227* (2013.01); *F02P 3/0407* (2013.01); *F02P 3/0442* (2013.01); *F02P 5/145* (2013.01); *F02P 9/007* (2013.01); *F02P 15/08* (2013.01); *F02P 17/12* (2013.01); *F02P 2017/121* (2013.01); *G01R 19/165* (2013.01)

(58) Field of Classification Search
CPC .... F02P 15/08; F02P 3/05; F02P 17/12; F02P 3/0407; F02P 3/0442; F02P 9/007; F02D 2009/0277; F02D 2041/227; G01R 19/165
USPC .................................................. 123/620, 636
See application file for complete search history.

(56) References Cited

U.S. PATENT DOCUMENTS 2,131,018 A * 9/1938 Scott ....................... F02P 15/08
315/231
2,226,711 A * 12/1940 Dukelow .............. H01T 13/462
313/123

(Continued)

FOREIGN PATENT DOCUMENTS

| GB | 191311660 A | * 2/1914 | ............. F02P 17/00 |
|---|---|---|---|
| JP | 2004-239143 | 8/2004 | |

*Primary Examiner* — Grant Moubry
*Assistant Examiner* — Joshua Campbell
(74) *Attorney, Agent, or Firm* — Nixon & Vanderhye P.C.

(57) ABSTRACT

An ignition control system is applied to an internal combustion engine having an ignition coil, a switching element and a measurement detection part which detects at least one of a primary and a secondary voltages and a secondary current. The ignition coil has a primary coil and a secondary coil. The switching element performs conduction and interruption the primary current to the primary coil. The ignition control system has a primary current control unit generating a spark discharge at the ignition plug by passing the primary current through the primary coil, and perform interruption of the primary current, and a discharge short-circuiting determination part determining a generation of discharge short-circuiting based on a measured value. The primary current control unit generates the spark discharge again when discharge short-circuiting occurs.

9 Claims, 6 Drawing Sheets

(51) Int. Cl.
　　　*F02D 9/02*　　　　(2006.01)
　　　*F02P 9/00*　　　　(2006.01)
　　　*F02P 5/145*　　　(2006.01)
　　　*F02P 17/12*　　　(2006.01)

(56) References Cited

U.S. PATENT DOCUMENTS

| | | | | |
|---|---|---|---|---|
| 2,276,966 | A * | 3/1942 | Hanseli | H01T 13/05 |
| | | | | 123/633 |
| 2,505,150 | A * | 4/1950 | Schwartzwalder | H01T 13/465 |
| | | | | 315/59 |
| 3,394,285 | A * | 7/1968 | Lindsay | H01T 13/52 |
| | | | | 315/58 |
| 4,122,816 | A * | 10/1978 | Fitzgerald | F02P 9/007 |
| | | | | 123/143 B |
| 5,140,970 | A * | 8/1992 | Akaki | F02P 3/053 |
| | | | | 123/620 |
| 5,370,099 | A * | 12/1994 | Koelle | F02P 7/035 |
| | | | | 123/643 |
| 2003/0015174 | A1* | 1/2003 | Nishizawa | F02D 41/221 |
| | | | | 123/406.13 |
| 2007/0175461 | A1 | 8/2007 | Wada et al. | |
| 2013/0291833 | A1* | 11/2013 | Eisen | F02P 3/053 |
| | | | | 123/406.12 |
| 2015/0152832 | A1* | 6/2015 | Desai | F02P 9/002 |
| | | | | 123/625 |
| 2016/0222939 | A1* | 8/2016 | Tang | F02P 3/0442 |
| 2017/0037826 | A1 | 2/2017 | Nakayama | |
| 2017/0141545 | A1* | 5/2017 | Yamamoto | H03K 17/0828 |

\* cited by examiner

IGNITION CONTROL SYSTEM

This application is based on and claims the benefit of priority from earlier Japanese Patent Application No. 2016-153420 filed on Aug. 4, 2016, the description of which is incorporated herein by reference.

TECHNICAL FIELD

This invention relates to an ignition control system used for an internal combustion engine.

DESCRIPTION OF THE RELATED ART

Recently, a technology related to an engine combustion control of a lean fuel mixture (lean-burn engine), or EGR which recycles combustible gas mixture (hereinafter referred to as "the gas mixture") to cylinders of an internal combustion engine has been examined in order to improve economy of the internal combustion engine for a vehicle. In these techniques, as an ignition system to effectively burn fossil fuels included in the gas mixture, a multiple ignition system is adopted in some auto mobiles. In the multiple ignition system, a spark plug continuously performs discharge a plurality of times at an ignition timing of the internal combustion engine.

In the multiple ignition system, when an ignition plug performs spark discharge, blowing off of discharge spark may occur due to the flow of the gas mixture in the cylinders, when a secondary current is insufficient. Especially, in the multiple ignition system, when lean combustion (lean burn) is performed, a turbulent airflow of the gas mixture is usually inducted by generating a swirl flow and a tumble flow of the gas mixture in the cylinders. Then, a combustion speed of the gas mixture is improved. In this environment, a flow rate of the gas mixture in the cylinders tends to be increased, and blowing off of the discharge spark is easily caused. Furthermore, deterioration of a combustion state due to blowing off of the discharge spark becomes remarkable.

Japanese patent No. 4640282 will be referred to as patent document 1. As this countermeasure, in patent document 1, the flow rate of the gas mixture flowing through the cylinders is estimated by a changing aspect of a secondary current passing through a secondary coil. Then, the secondary current (hereinafter referred to as the "discharge maintaining current") which can reliably avoid the possibility of blowing off of the discharge spark, depending on the estimated flow rate of the gas mixture, is set. Specifically, as the estimated flow rate of the gas mixture becomes large, the discharge maintaining current is set to be large. In addition, a spark discharge period at each time is set to be a period in which the secondary current reaches the discharge maintaining current set depending on the flow rate of the gas mixture. Then, when the secondary current reaches the discharge maintaining current, conduction of a primary current is restarted. Thereby, a succeeding discharge may be performed by storing sufficient energy in a short charging period by forcibly terminating the discharge under the secondary current condition that may cause the blowout and start charging the ignition coil. This operation is repeated after a prescribed time, and blowing off of the discharge spark may be prevented. In addition, the gas mixture may be efficiently heated, and an initial flame for the discharge each time may be formed at the ignition plug. Furthermore, it is regarded that the gas mixture may be combusted.

When the gas mixture passing through the cylinders flows around the ignition plug, a path of the discharge spark (a discharge path) generated from the ignition plug is lengthened by the flow of the gas mixture. In order for some part of the gas mixture to be continuously heated, and the combustion state of the gas mixture be sufficient, it is required to supply a high current to the ignition coil for a long time to reduce blowing off of the discharge spark and to perform the discharge for a long time. In this case, the ignition coil needs to be enlarged to withstand the high current flow for a long time. In addition, there is a concern that electrode consumption of the ignition plug becomes increased because the discharge at the ignition plug occurs for a long time.

Then, as a first system, in a system of forming the initial flame for the discharge each time such as the multiple ignition system, an ignition control system is required which enables the size of the ignition coil and electrode exhaustion of the ignition plug to be reduced. In this case, each discharge period is prolonged as much as possible, and each of initial flame kernels, which is formed by the discharge, can be formed even more stably. The multiple ignition system is a system having only one ignition coil which repeats supply and interruption of the primary current. However, in the multiple ignition system, when each discharge period is prolonged, energy stored in the ignition coil (which will be referred to as "the coil energy") is reduced. Therefore, a long charge period for the next discharge needs to be secured. As a result, a distance between the plurality of the initial flames becomes long, therefore, a sufficient ignition effect may not be obtained. On the other hand, as a second system, it is also thought that a charging interval should be made short to decrease the time between the plurality of the initial flames. In addition, it is also thought that each discharge period should be made short to reduce the coil energy (energy stored in a coil energy temporarily). Therefore, the charge period for the next discharge may be made short. In both the first system and the second system, heating using only one discharge is insufficient, and the sufficient initial flame may not be formed. Therefore, a sufficient ignition effect may not be obtained. That is, a discharge time and a quiescent time of the discharge (a charge time of the ignition coil) needs to be set to realize sufficient ignition performance by the multiple ignition system, using the only one ignition coil. A multiple ignition control, which controls blowing off of the discharge spark as in patent document 1, has the desired ignition effect.

However, until the discharge spark is extended and is blown out, the discharge spark is not extended infinitely, and the discharge spark may be shortened. This is because in the case that the discharge spark is extended into a U shape, when a distance between parts of the discharge spark facing each other is shortened, parts of the discharge spark may become joined. So that, a part of the discharge spark extending outward from the joined parts of the discharge spark may disappear. Thus, a phenomenon in which a length of the extended discharge spark is shortened is hereinafter referred to as "discharge short-circuiting". When discharge short-circuiting occurs, a first part of the gas mixture, which has been heated until now, is not heated and a part of the gas mixture away from the first part of the gas mixture is heated. Even if discharge short-circuiting occurs and the spark discharge is continuously generated as it is, the gas mixture may not be sufficiently ignited and combusted. A technology described in patent document 1 may reduce blowing off of the discharge spark in the multiple ignition system each time. However, the technology described in patent document 1 cannot cope with deterioration of the ignition and the combustion state due to discharge short-circuiting. In short, in the technology described in patent document 1, the discharge is continuously performed after discharge short-circuiting occurs. It is thought that a recharge time to perform the next discharge, that is, the quiescent time of the spark discharge, becomes long. As a result, the quiescent time of the discharge between the initial flame formed by a discharge and the next initial flame becomes long. Therefore, the ignition of the gas mixture may be deteriorated. In short, each discharge may not form a sufficiently large initial flame, and deterioration of the combustion state of the gas mixture may not be avoided. Thus, ignition control under conditions of a lean gas mixture is currently insufficient. Therefore, further improvement of the ignition system is desired.

SUMMARY

The present disclosure provides an ignition control system which is capable of obtaining good ignition performance and a good combustion state of a gas mixture by discharge energy supplied after discharge short-circuiting occurs being used for second or later discharges.

The ignition control system of the present invention has an ignition plug, a primary coil and a secondary coil. The ignition plug generates spark discharge for igniting a combustible gas mixture in cylinders of an internal combustion engine, between a pair of discharge electrodes. The ignition control system is adopted in an internal combustion engine which has an ignition coil, a switching element and a measurement detection part. The ignition coil applies a voltage to the ignition plug using the secondary coil. The switching element performs conduction and interruption of a primary current passing through the primary coil. The measurement detection part detects a measured value of at least one of a primary voltage applied to the primary coil, a secondary current passing through the ignition plug and a secondary voltage applied to the ignition plug. The ignition control system has also a primary current control unit and a discharge short-circuiting determination part. The primary current control unit executes discharge generation control by interruption the primary current after the ignition control system makes the switching element pass the primary current through the primary coil. Discharge generation control generates the spark discharge at the ignition plug. The primary current control unit executes discharge generation control one time or a plurality of times during one combustion cycle. A discharge short-circuiting determination part determines whether discharge short-circuiting has occurred or not based on the measured value detected from the measurement detection part. Discharge short-circuiting is a phenomenon where an extended discharge spark is shortened. When the discharge short-circuiting determination part determines that discharge short-circuiting has occurred, the primary current control unit makes the switching element pass the primary current through the primary coil (see FIG. 4). After that, interruption of the primary current is performed, and discharge generation control may be executed again.

Even if the combustible gas mixture in the cylinder flows around the ignition plug, some part of the combustible gas mixture may be continuously heated (see FIG. 2). This is because the combustible gas mixture together with the discharge move and are extended in a flow direction of the combustible gas mixture. Therefore, the combustion state of the gas mixture may be improved. When discharge short-circuiting occurs while the discharge is being extended, a first part of the gas mixture, which has been heated until now, is not heated and a part of the gas mixture away from the first part of the gas mixture is heated. Even if discharge short-circuiting occurs and the spark discharge is continuously generated as it is, the gas mixture may not be sufficiently ignited and combusted. Then, when discharge short-circuiting determination part determines that discharge short-circuiting has occurred based on the measured value detected from the measurement detection part, the primary current control unit makes the switching element pass the primary current through the primary coil. Thereby, the spark discharge generated at the ignition plug is stopped. Then, coil energy stored in the primary coil may also be charged such that it is large enough to form a prescribed initial flame for succeeding re-discharge for the discharge each time after a further short time under conditions of a lean gas mixture. Furthermore, a generation interval between an initial flame for the discharge each time produced at the time of discharge short-circuiting occurring and the initial flame at the time of re-discharge may be shortened. Thereby, both the initial flames are stably overlapped. Thereby, the ignition performance and the combustion state of the gas mixture may be improved.

DETAILED DESCRIPTION OF THE PREFERRED EMBODIMENTS

Figure 1:
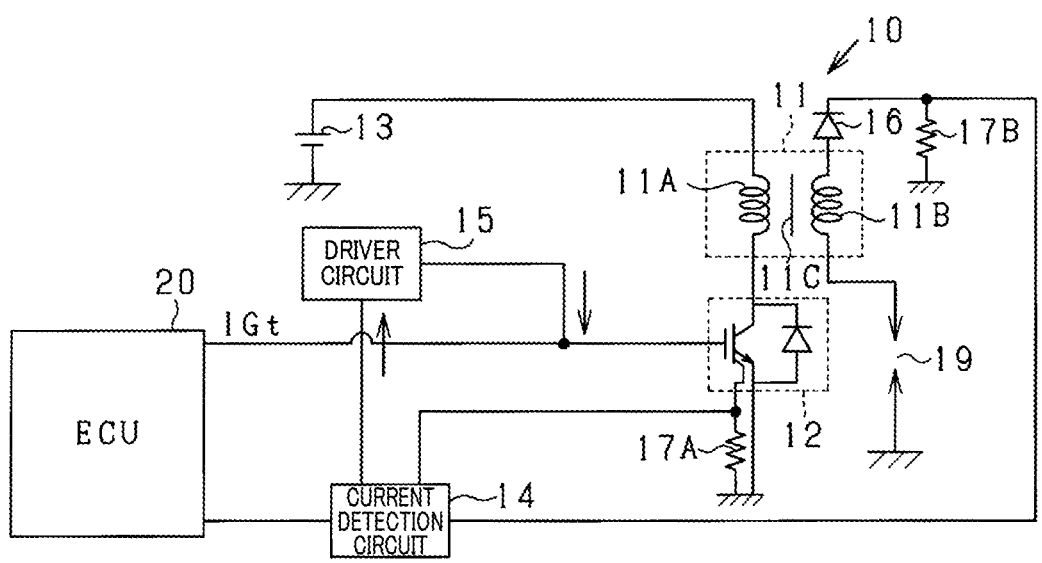
FIG. 1 shows an approximate circuit diagram around an ignition circuit unit according to the present embodiment.

The present embodiment will be described below referring to the drawings. An ignition circuit unit 10 shown in FIG. 1 is provided with an ignition coil 11, an IGBT 12 (corresponding to a switching element), a power supply 13, a current detection circuit 14, a driver circuit 15 and an ignition plug 19.

The ignition coil is provided with a primary coil 11A, a secondary coil 11B and an iron core 11C. The primary coil 11A has a first end and a second end. The first end of the primary coil 11A is connected to the power supply 13. The second end of the primary coil 11A is connected to a collector terminal of the IGBT 12. In addition, an emitter terminal of the IGBT 12 is connected to a ground potential via a resistor 17A (hereinafter referred to as "the resistor 17A") for detecting a primary current. In addition, the resistor 17A is connected with the current detection circuit 14 detecting the primary current passing through the resistor 17A.

The secondary coil 11B has a first end and a second end. A resistor 17B (hereinafter referred to as "resistor 17B") for detecting a secondary current has a first end and a second end. The first end of the secondary coil 11B is connected with the first end of the resistor 17B via a diode 16. The second end of the resistor 17B is grounded. The diode 16 prevents a current from flowing in a direction from the grounded side to the second end of the secondary coil 11B via the resistor 17B. In addition, an anode of the diode 16 is connected with the first end of the secondary coil 11B so as to define a flow direction of the secondary current (a discharge current) from the ignition plug 10 to the secondary coil 11B.

The resistor 17B is connected with the current detection circuit 14 of detecting the secondary current passing through the resistor 17B. The current detection circuit 14 detects the primary current passing through the resistor 17A and the secondary current passing through the resistor 17B, and outputs the secondary current to an electronic control unit 20 (hereinafter referred to as "ECU"). Accordingly, the current detection circuit 14 corresponds to a measurement detection part.

The second end of the secondary coil 11B is connected with the ignition plug 19 disposed in a vicinity of the ignition circuit unit 10.

The ECU 20 generates an ignition signal IGt based on external information. In addition, the generated ignition signal IGt is outputted to a gate terminal of the IGBT 12, and the IGBT 12 passes the primary current through the primary coil 11A. In addition, when the primary current detected using the current detection circuit 14 reaches a determination value, an output of the ignition signal IGt is stopped, and the primary current does not flow from the IGBT 12 toward the primary coil 11A (refer to a time t1 shown in FIG. 4). Thereby, a high voltage is induced in the secondary coil 11B, and the gas mixture around a spark gap of the ignition plug 19 suffer insulation breakdown. Thereby, spark discharge is generated at the ignition plug 19.

Discharge spark generated at the ignition plug 19 may be extended in a U shape. This is because the discharge spark is moved by a flow of the gas mixture around the ignition plug 19. Especially, when lean combustion (lean burn) is performed, a swirl flow and a tumble flow of the gas mixture are generated, and turbulent airflow of the gas mixture is induced. Thereby, a combustion speed may be usually improved. A flow rate of the gas mixture in cylinders of an internal combustion engine tends to be increased under this environment, and the discharge spark is easily extended.

Figure 2:
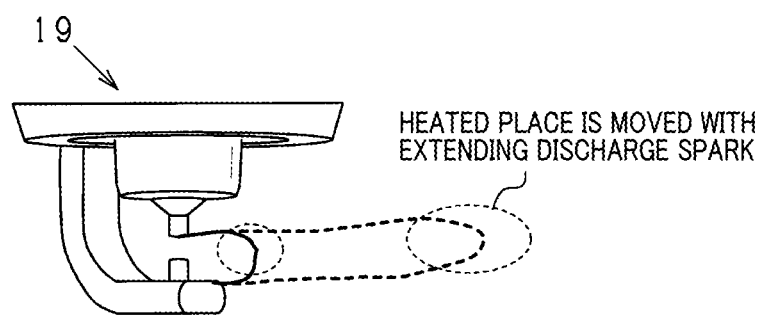
FIG. 2 shows an explanatory view of a generation mechanism of discharge short-circuiting.

When the gas mixture passing through the cylinders flows around the ignition plug 19, the discharge spark is extended by flowing the gas mixture. Thereby, some part of the gas mixture may be continuously heated, thus a combustion state of the gas mixture may be improved (refer to FIG. 2).

Figure 3:
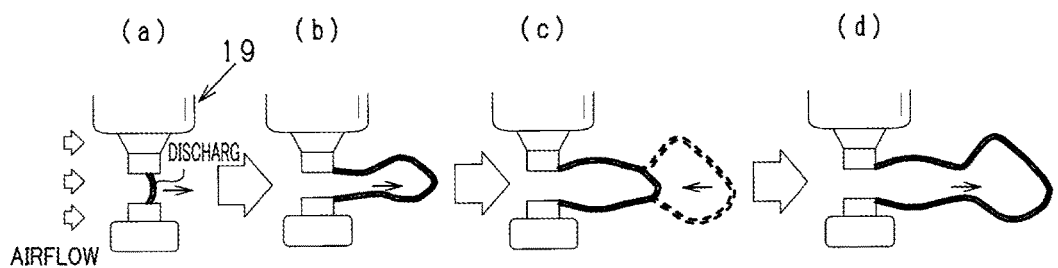
FIG. 3 shows an explaining drawing of a reason why an extended discharge spark allows a combustion state of a gas mixture to be improved.

Incidentally, the discharge spark is not infinitely extended in a period until the discharge spark is extended and is blown out, and the discharge spark may be shortened. The above-described state is shown in FIG. 3. The discharge spark generated between discharge electrodes of the ignition plug 19 is extended in a U shape by the gas mixture flowing in the cylinders (refer to FIG. 3(*a*) to (*b*)). In the discharge spark extended in the U shape, when a distance between parts of the discharge spark facing each other is shortened, those parts of the discharge spark may become joined. Therefore, a part of the discharge spark extending from the joined parts of the discharge spark will disappear (refer to FIG. 3(*c*)). Hereinafter, a phenomenon of shortening the extended discharge spark is referred to as "discharge short-circuiting". The discharge spark having discharge short-circuiting is extended again by the gas mixture flowing in the cylinders (refer to FIG. 3(*d*)). The first part of the gas mixture (which will be referred to as the combustible gas mixture), which was heated, stops being heated and a first part of the gas mixture away from the first part of the gas mixture is heated by a length equivalent to shorten the discharge spark. Even when a process for reducing blowing off of the discharge spark is performed, the gas mixture may not be efficiently heated. Thereby, is it expected that an ignition performance of the gas mixture will be poor.

Figure 4:
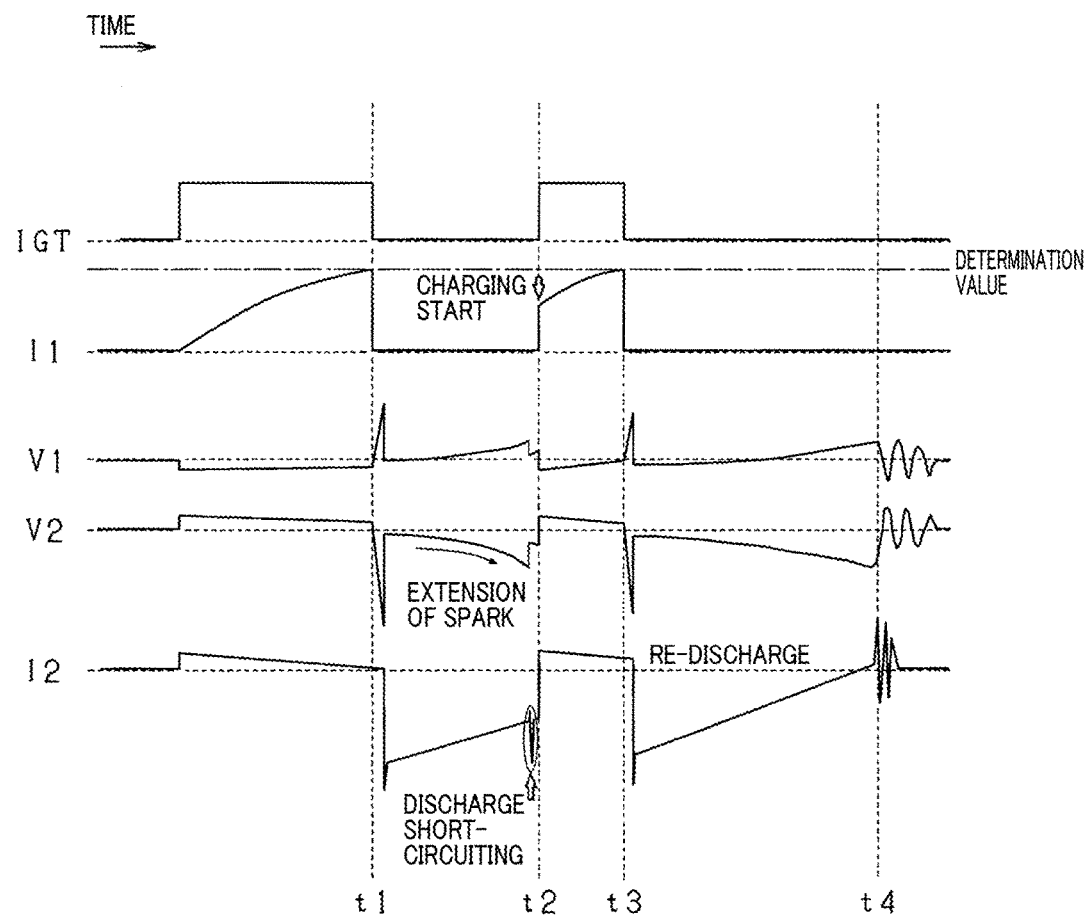
FIG. 4 shows a timing chart showing a processing procedure of charge-discharge control according to the present embodiment.

As a countermeasure against this, the ignition circuit unit 10 is provided with the driver circuit 15, and the driver circuit 15 performs a process shown in FIG. 4.

Specifically, on condition that the driver circuit 15 determines that discharge short-circuiting has occurred, as described below, after the spark discharge is generated at the ignition plug 19, the driver circuit 15 outputs the ignition signal IGt to the gate terminal of the IGBT 12 again (refer to a time t2). Thereby, the spark discharge generated at the ignition plug 19 is stopped, and a coil energy is supplied from the power supply 13 to the primary coil 11A. In addition, when the primary current detected form the current detection circuit 14 reaches the determination value, the output of the ignition signal IGt to the gate terminal of the IGBT 12 is stopped using the driver circuit 15. Then, a re-discharge at the ignition plug 19 is performed (refer to a time t3).

In the present embodiment, when the driver circuit 15 determines that discharge short-circuiting has occurred at the ignition plug 19, re-discharge is performed only once. Accordingly, even if the spark discharge generated by performing re-discharge results in this discharge also short-circuiting during a discharge period as a period to generate the spark discharge at the ignition plug 19, a re-re-discharge at the ignition plug 19 is not performed. In addition, it is shown that the spark discharge is stopped by reducing the coil energy at a time t4 shown in FIG. 4. This is because the discharge spark generated by performing re-discharge is continuously extended without any occurrence of discharge short-circuiting.

The discharge short-circuiting is occurred by the discharge spark being extremely extended due to flow of the mixture gases. In the case that the spark discharge is stopped without occurring discharge short-circuiting during the discharge period after the spark discharge is generated at the ignition plug 19 in the first time, the flow rate of the gas mixture is low enough not to occur discharge short-circuiting. Thereby, it is thought likely that the environment is poor for igniting the gas mixture. Therefore, in the above-described state, re-charge is forcibly performance at the ignition plug 19, and a second re-discharge is then performed.

Thus, the driver circuit 15 is a discharge short-circuiting determination part. In addition, the ignition signal IGt is outputted to the gate terminal of the IGBT 12 using the ECU 20 and the driver circuit 15. Therefore, conduction and interruption of the primary current to the primary coil 11A is controlled using the ECU 20 and the driver circuit 15. Thereby, the ECU 20 and the driver circuit 15 correspond to a primary current control unit.

A determination method (hereinafter refer to as "the detection of discharge short-circuiting") of determining whether discharge short-circuiting is occurring or not will be described below.

Figure 5:
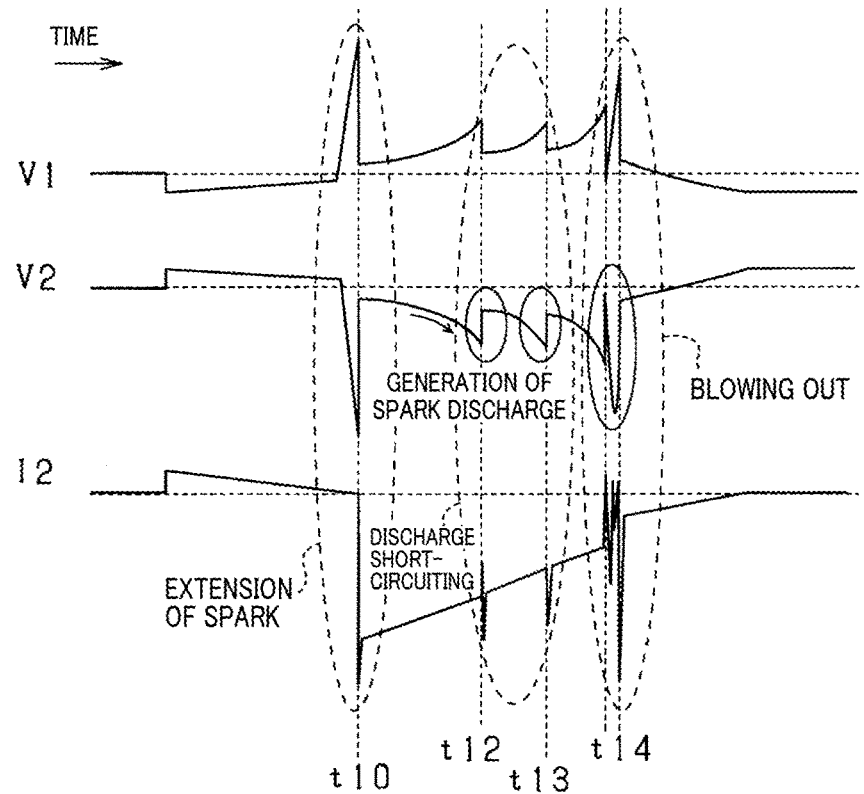
FIG. 5 shows a relationship between a changing aspect of a parameter when discharge short-circuiting occurs and a changing aspect of a parameter when blowing off of the discharge spark occurs.

Changing aspects of a primary voltage, a secondary voltage and the secondary current when discharge short-circuiting and blowing off of the discharge spark occur are shown in FIG. 5. In common to parameters of the primary voltage, the secondary voltage and the secondary current, an instantaneous large fluctuation is generated a plurality of times during one combustion cycle (refer to times t10 to t14). A first instantaneous large variation is generated by blocking the primary current after the primary current passes through the primary coil 11A using the IGBT 12 for the first time (refer to a time t 10). The first instantaneous large variation corresponds to an electric current of a capacitor discharge when the spark discharge is generated at the ignition plug 19. In addition, after a maximum value of the secondary current reaches 0, an instantaneous large fluctuation is generated a second time or later (refer to time t14). The instantaneous large fluctuation (refer to time t14) is the current peak having the same steepness as the first instantaneous large fluctuation. It is thought that generating the instantaneous large fluctuation (refer to a time t14) is a sign of blowing off of the discharge spark and re-discharge are occurring. The blowing off of the discharge spark and re-discharge means that the discharge is generated again by increasing the secondary voltage again using the remaining coil energy after blowing off of the discharge spark. On the other hand, the instantaneous large fluctuation whose fluctuation amount is larger than a predetermined value but is relatively small (refer to times t12 to t13) shows that discharge short-circuiting occurs. In addition, instantaneous large fluctuations (refer to times t12 to t13) occur between the instantaneous large fluctuation generated when the spark discharge is generated at the ignition plug 19 and the instantaneous large fluctuation generated when the spark discharge is blown out. The instantaneous large fluctuations (refer to the area between times t12 and t13) occurs when the discharge resistance is rapidly changed by shortening a path of the discharge spark due to discharge short-circuiting. The predetermined value is a value set to distinguish a fluctuation of the slight discharge resistance from an instantaneous fluctuation of a measured value of noise superimposed on the current detection circuit 14. The slight discharge resistance is generated by an instability of an extension speed of the discharge spark depending on a flow state of the gas mixture.

In short, an instantaneous fluctuation of a measured value occurring when discharge short-circuiting occurs is an instantaneous fluctuation of a measured value which is generated for the first time during one combustion cycle after the spark discharge is generated at the ignition plug 19 for the first time. In addition, a fluctuation amount of the instantaneous fluctuation when discharge short-circuiting occurs is larger than the instantaneous fluctuation when noise is generated. In addition, the fluctuation amount of the instantaneous fluctuation when discharge short-circuiting occurs is smaller than a fluctuation amount of the instantaneous fluctuation when the spark discharge occurs at the ignition plug 19. Furthermore, the fluctuation amount of the instantaneous fluctuation when discharge short-circuiting occurs is smaller than a fluctuation amount of the instantaneous fluctuation when the discharge spark is blown out and re-discharge is performed.

In the present embodiment, the detection of discharge short-circuiting is performed based on the secondary current. This is because there is a large difference between a fluctuation amount of the secondary current when the discharge spark is blown out and a fluctuation amount of the secondary current when discharge short-circuiting occurs. Thereby, the instantaneous fluctuation when discharge short-circuiting occurs and the instantaneous fluctuation when the discharge spark is blown out may be relatively easily distinguished.

Specifically, the detection of discharge short-circuiting based on the secondary current will be described below. As shown in a lower half of FIG. 6, a differential value of the secondary current is calculated. In addition, supply and interruption of the primary current to the primary coil 11A using the IGBT 12 for the first time during one combustion cycle are performed. Thereby, after the spark discharge is generated, discharge short-circuiting determination part detects an instantaneous fluctuation of a first measured value whose maximum value of the differential value of the secondary current is larger than a second threshold. The second threshold is a threshold set for detecting an instantaneous fluctuation of the differential value whose secondary current is larger than a predetermined value. Therefore, after the spark discharge is generated at the ignition plug 19, a discharge short-circuiting determination part may detect an instantaneous fluctuation of a measured value which is larger than the instantaneous fluctuation when noise is occurring. However, only in this condition, the instantaneous fluctuation generated when the discharge spark is blown out may accidentally be detected. Accordingly, instantaneous fluctuation of the differential value of the secondary current having a maximum value larger than the second threshold is detected. In addition, a value difference, which is smallest of a value difference whose secondary current is from 0 to the maximum value, is also referred to as "the minimum value of the absolute value of the secondary current". An instantaneous fluctuation of a measured value whose minimum value of the absolute value of the secondary current is larger than a predetermined value A (corresponds to a first threshold) is also detected. The predetermined value A is set for recognizing the secondary current being 0.

In addition, discharge short-circuiting is a specific phenomenon occurring only when the discharge spark is extended. Accordingly, a time at which the instantaneous fluctuation in the spark discharge is generated for the first time is defined as "time A". A predetermined mask time T is a time during which the discharge spark is sufficiently extended and when discharge short-circuiting may be generated. Discharge short-circuiting is not detected using the first threshold and the second threshold during the predetermined mask time T after the time A. Thereby, in an initial period of the discharge spark not extending, wrong determination of occurrence of discharge short-circuiting due to incidental noise or disturbance of the spark discharge state may be reduced.

Thus, first occurrence of an instantaneous fluctuation having a maximum value of the differential value of the secondary current which is larger than the second threshold after the predetermined mask time T is elapsed from the time A is detected. In addition, it is determined that a discharge short-circuiting has occurred when a first instantaneous variation in which the minimum value of the secondary current is larger than the predetermined value A is detected. Incidentally, the present embodiment is not limited to the secondary current. Detecting occurrence of discharge short-circuiting based on the primary voltage and the secondary voltage may also be performed.

Figure 7:
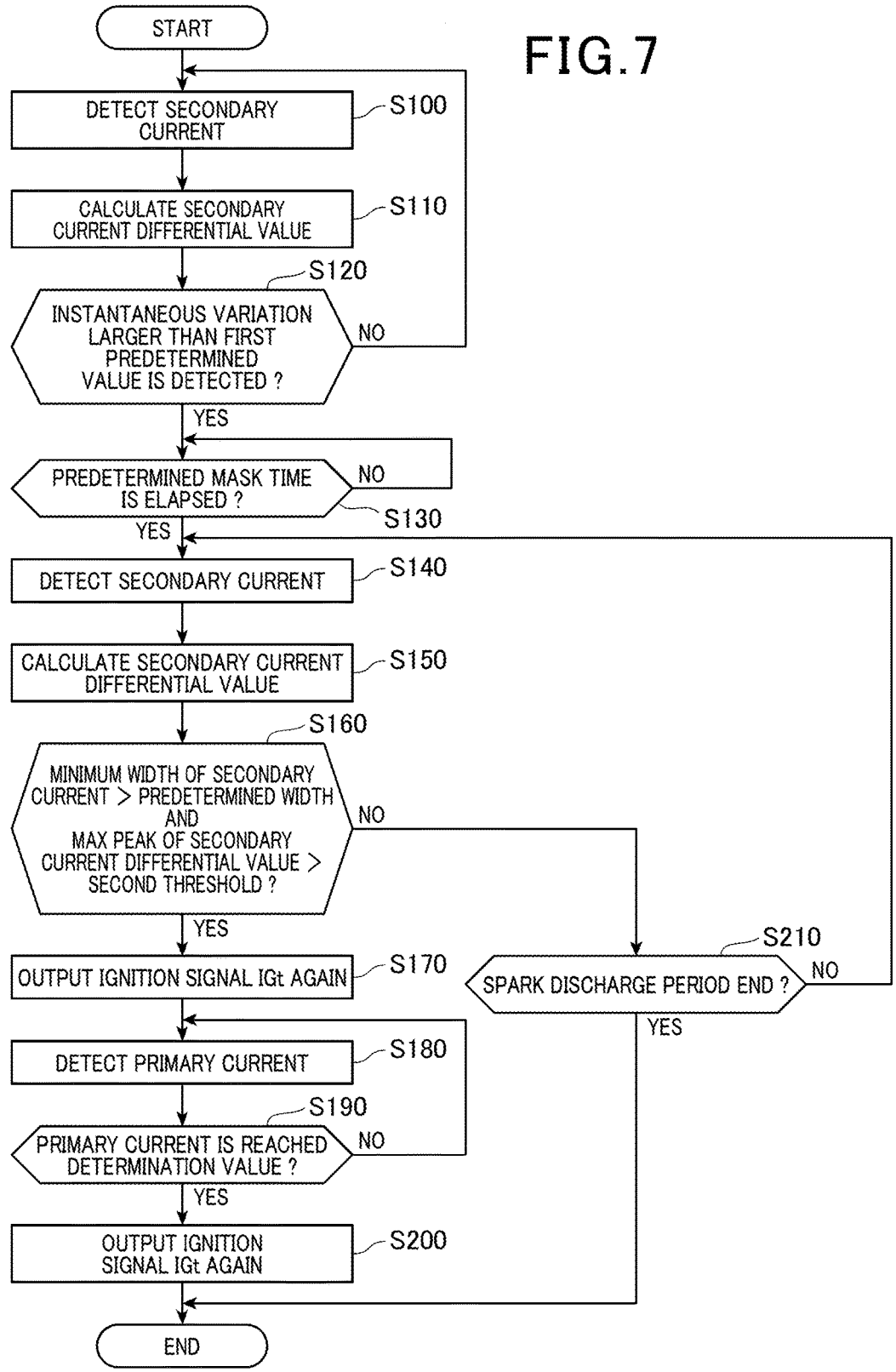
FIG. 7 shows a control flow chart performed by a driver circuit according to the present embodiment.

In the present embodiment, the charge-discharge control shown in FIG. 7 is performed using the driver circuit 15. The charge-discharge control shown in FIG. 7 is performed using the driver circuit 15 after starting the discharge.

First, in step S100, the secondary current detected by the current detection circuit 14 is acquired. Next, in step S110, the differential value of the acquired secondary current is calculated. In step S120, it is determined whether or not the first instantaneous variation A in which the differential value of the secondary current is larger than the second threshold has been detected after forming the discharge spark by conducting and interrupting the primary current by the primary current by the primary coil 11A using the IGBT 12 during one combustion cycle. The IGBT 12 allows the primary current to pass through the primary coil 11A during one combustion cycle. Then, when discharge short-circuiting determination part determines that the instantaneous fluctuation A has not been detected (S120: NO), it is determined that the spark discharge itself has not been generated. Then, the process returns to step S100. Supply and interruption of the primary current to the primary coil 11A is performed using the IGBT 12 during one combustion cycle. Then, when discharge short-circuiting determination part determines that the instantaneous fluctuation A has been detected, it is determined that the spark discharge has been started (S120: YES). Then, the process proceeds to step S130.

In step S130, it is determined whether the predetermined mask time T has elapsed or not after the instantaneous fluctuation A has been detected (after it is determined that the spark discharge has started at the ignition plug 19). When it is determined that the predetermined mask time T has not elapsed after the instantaneous fluctuation A is detected (S130: NO), step S130 is performed again. When it is determined that the predetermined mask time T has elapsed after the instantaneous fluctuation A has been detected (S130: YES), the process proceeds to step S140.

In step S140, the secondary current detected by the current detection circuit 14 is acquired again. In addition, in step S150, the differential value of the secondary current acquired in step S140 is calculated.

In step S160, it is determined whether an instantaneous fluctuation of a measured value whose maximum value of the differential value of the secondary current is larger than the second threshold has been detected for a second time or not. In addition, it is also determined whether the instantaneous fluctuation whose minimum value of the absolute value of the secondary current is larger than the predetermined value A has been detected for the second time or not. In step S160, when the determination result is affirmative (S160: YES), the process proceeds to step S170. In step S170, the ignition signal IGt is outputted to the gate terminal of the IGBT 12 again. After that, in step S180, the primary current detected by the current detection circuit 14 is acquired.

In step S190, it is determined whether the acquired primary current has reached the determination value or not. When it is determined that the acquired primary current has not reached the determination value (S190: NO), the process is returned to step S180. When the acquired primary current has reached the determination value (S190: YES), the process returns to step S200. In step S200, the output of the ignition signal IGt to the gate terminal of the IGBT 12 is stopped, and the current process is terminated.

When the determination result in step S160 is negative (S160: NO), the process proceeds to step S210. In step S210, it is determined whether the spark discharge has been terminated or not. When it is determined that the spark discharge has been terminated (S210: YES), the process is terminated. When it is determined that the spark discharge period has not been terminated (S210: NO), the process returns to step S140.

By the above-described configuration, the present embodiment has the following effects.

When it is determined that discharge short-circuiting has occurred when the spark discharge is generated for the first time at the ignition plug 19 and thereafter, the spark discharge generated at the ignition plug 19 is stopped. Then, heating of the gas mixture by a first spark discharge is stopped. However, the primary coil 11A is still storing the coil energy. Therefore, a time until the primary current reaches the determination value which blocks the primary current may be shortened. In short, the spark discharge generated at the ignition plug 19 is stopped, and the primary coil 11A is still storing the coil energy. In addition, a period until re-discharge is performed is shortened. Thereby, the initial flames formed by the respective spark discharge may be formed so as to be arranged closely. In addition, a spark discharge period of the first spark discharge and a spark discharge period of re-discharge may have a large enough duration to heat sufficiently the gas mixture. The initial flames are overlapped, and the ignition performance of the gas mixture may be improved.

Figure 8:
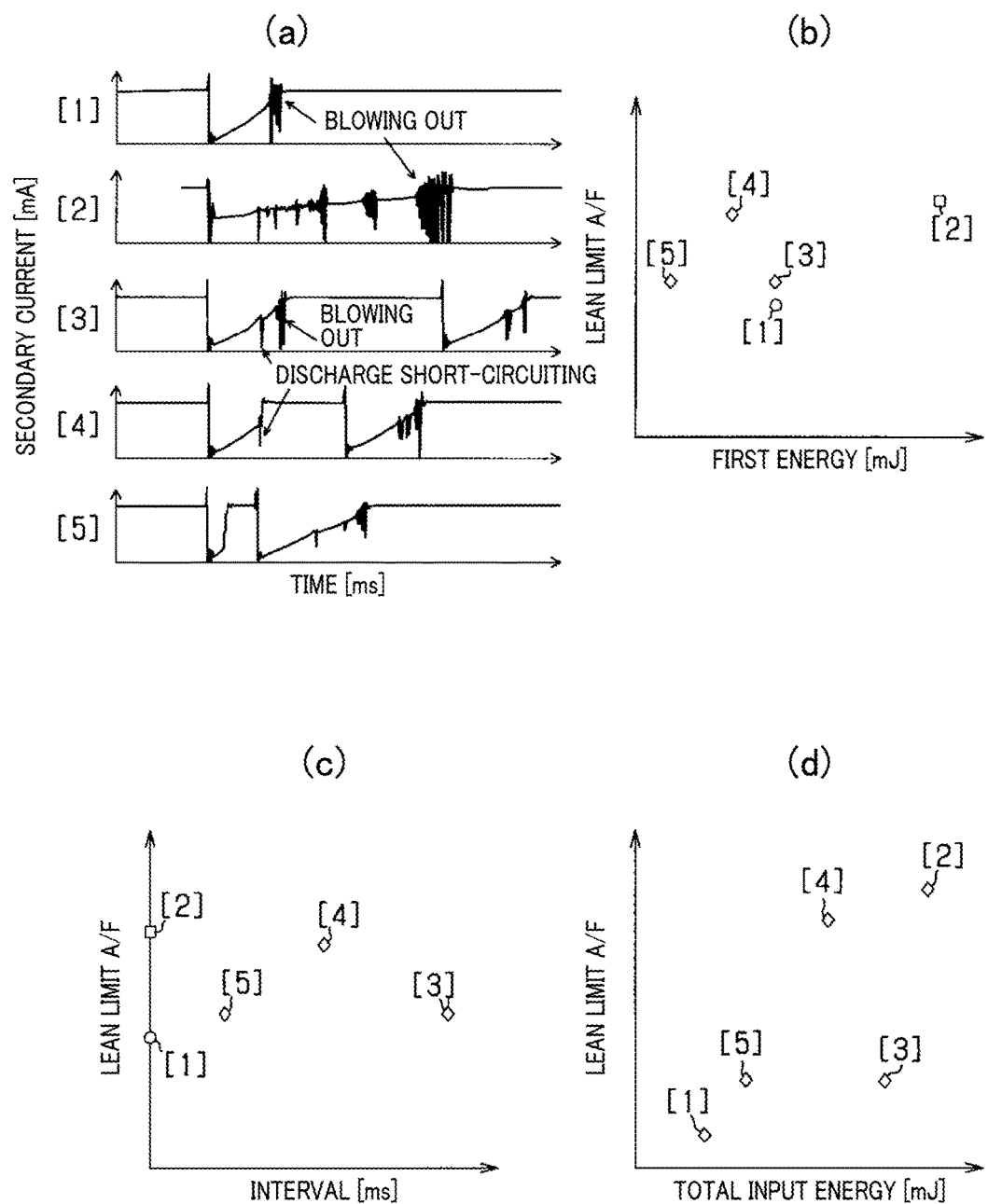
FIG. 8 shows a timing chart and graphs showing effects exerted by the charge-discharge control according to the present embodiment.

As shown in FIG. 8, the combustion state of the gas mixture is improved by performing the charge-discharge control according to the present embodiment. The changing aspects [1] to [5] of the secondary current when charging and discharging are controlled are performed with various settings is shown in FIG. 8(a). Effects when the charge-discharge controlling patterns [1] to [5] shown in FIG. 8(a) are performed are shown in FIGS. 8(b) and (c). Energy inputted for the first time to the ignition plug 19 at the time of the spark discharge during one combustion cycle is hereinafter referred to as the "initial input energy". In addition, an interval until re-discharge is performed at the ignition plug 19 after the first spark discharge is performed at the ignition plug 19 is defined as "the interval A". Specifically, FIG. 8(b) shows a relationship between the initial input energy and a lean limit value of an air-fuel ratio. FIG. 8(c) shows a relationship between the interval A and the lean limit value of the air-fuel ratio.

As shown in FIG. 8(a), in a charge-discharge controlling pattern [1], the spark discharge is generated only once at the ignition plug 19 without performing re-discharge at the ignition plug 19. The charge-discharge controlling pattern [1] is hereinafter referred to as "[1]". In addition, the secondary current is gradually reduced with a discharge of discharge energy, and the secondary current becomes less than a discharge maintaining current. The discharge maintaining current is a secondary current having no possibility of blowing off of the discharge spark. Blowing off of the discharge spark and re-discharge is generated several times, and the coil energy is completely depleted. Thereby, the spark discharge is stopped. As a result, a period when the spark discharge is generated at the ignition plug 19 in the charge-discharge controlling pattern [1] is the shortest in comparison to charge-discharge controlling patterns [2] to [5]. Therefore, it is shown that the lean limit value of the air-fuel ratio is low, and the combustion state of the gas mixture is poor in FIGS. 8(b) and (c).

As shown in FIG. 8(a), in a charge-discharge controlling pattern [2], the spark discharge is generated at the ignition plug 19 only once without performing re-discharge at the ignition plug 19 in the same way as [1]. The charge-discharge controlling pattern [2] is hereinafter referred to as "[2]". Incidentally, as shown in FIG. 8(b), in comparison to [1], the initial input energy of [2] is large. Specifically, the inputted initial input energy of [2] is approximately twice as great as the inputted initial input energy of [1]. Accordingly, even if discharge short-circuiting and blowing off of the discharge spark and re-discharge occur, the spark discharge is generated at the ignition plug 19 for a long time (refer to FIG. 8(a)). This is because sufficient coil energy remains in the primary coil with extending the discharge spark generated at the ignition plug 19. In short, a time of contacting the gas mixture with the spark discharge becomes long, and the initial flame similar to multiple discharges, in which the interval A is shortened, may be formed. Therefore, as shown in FIGS. 8(b) and (c), in comparison to [1], even if the air-fuel ratio is made even leaner, the gas mixture may be stably combusted. In other words, the lean limit value of the air-fuel ratio may be increased.

As shown in FIG. 8(a), in a charge-discharge controlling pattern [3], when the discharge spark generated at the ignition plug 19 is blown out due to depleting the coil energy, re-discharge is performed. The charge-discharge controlling pattern [3] is hereinafter referred to as "[3]". Then, when the first spark discharge is stopped, there is no coil energy stored in the primary coil 11A. Therefore, as shown in FIG. 8(c), in comparison to charge-discharge controlling patterns [4] and [5] as described below, the interval A of [3] is long. Accordingly, in comparison to [1], despite a generation period of the spark discharge becoming longer, it is difficult for the initial flame ignited by the first spark discharge and the initial flame ignited by the spark discharge when re-discharge is performed to be overlapped. Therefore, the lean limit value of the air-fuel ratio may not be enlarged (refer to FIGS. 8(b) and (c)).

As shown in FIG. 8(a), in the charge-discharge controlling pattern [4], when discharge short-circuiting occurs, re-discharge is performed. In this case, the coil energy is stored in the primary coil 11A. The charge-discharge controlling pattern [4] is hereinafter referred to as "[4]". As shown in FIG. 8(c), the interval A of [4] may be short in comparison to [3]. An initial flame, which is formed as large as possible by heating the gas mixture repeatedly until discharge short-circuiting occurs due to the first spark discharge, is defined as "the initial flame A". Therefore, the initial flame A and the initial flame formed by performing the second re-discharge may be overlapped. Thereby, the lean limit value of the air-fuel ratio may be greatly enlarged (refer to FIGS. 8(b) and (c)). In addition, as shown in FIG. 8(d), [4] may be compared with [2] in regards to a total input energy inputted in the ignition plug 19 during the discharge period. The lean limit value of the air-fuel ratio of [4] may be enlarged to nearly the same as [2] having the large total input energy of [2] (the initial input energy of [2]) despite the total input energy of [4] being small.

As shown in FIG. 8(a), in the charge-discharge controlling pattern [5], the spark discharge generated at the ignition plug 19 is stopped before discharge short-circuiting occurs. The charge-discharge controlling pattern [5] is hereinafter referred to as "[5]". After that, re-discharge is performed. In this case, a lot of the coil energy is stored in the primary coil 11A. As shown in FIG. 8(c), the interval A becomes greatly shorter. However, the generation period of the first spark discharge is short, and the gas mixture may not be sufficiently heated by the first spark discharge. As a result, the lean limit value of the air-fuel ratio may be not greatly enlarged (refer to FIGS. 8(b) and (c)).

As a result, when discharge short-circuiting occurs, the spark discharge generated at the ignition plug 19 is stopped. In addition, re-discharge is performed. Thereby, the initial input energy may be reduced and the lean limit value of the air-fuel may be significantly increased.

Conduction and interruption of the primary current to the primary coil 11A are performed using the IGBT 12, and the spark discharge is formed for the first time during one combustion cycle. After that, it is determined whether discharge short-circuiting is occurring. Then, the first instantaneous fluctuation whose maximum differential value of the secondary current is larger than a second threshold is detected. This first instantaneous fluctuation having a maximum differential value of the secondary current larger than a second threshold is an instantaneous fluctuation of a measured value whose secondary current is larger than the predetermined value. Accordingly, detection of instantaneous fluctuation of the secondary current and noise generated when the spark discharge is generated at the ignition plug 19 may be reduced. Furthermore, accuracy of detecting discharge short-circuiting may be improved.

The first instantaneous fluctuation having maximum differential value of the secondary current larger than a second threshold is defined as an "instantaneous fluctuation B". Until the predetermined mask time T is elapsed from the time A is detected, even if an instantaneous fluctuation occurs with a differential value of the secondary current larger than the second threshold, this is not detected as an instantaneous fluctuation B. Thereby, in the initial period of the discharge spark not extending, erroneous detection of discharge short-circuiting due to incidental noise or disturbance of the secondary current may be reduced.

In the present embodiment, the primary current is passed through the primary coil 11A using the IGBT 12. In addition, when the primary current reaches the determination value, conduction of the primary current to the primary coil 11A is blocked using the IGBT 12. Thereby, spark discharge is generated at the ignition plug 19. Thereby, excessive supply of coil energy to the primary coil 11A may be reduced. In addition, re-discharge may be performed stably at the ignition plug 19.

According to the present embodiment, occurrence of discharge short-circuiting is detected. Then, an instantaneous fluctuation of a measured value having a maximum differential value of the secondary current larger than the second threshold is detected. In addition, in the present embodiment, an instantaneous fluctuation whose minimum value of the absolute value of the secondary current is larger than the predetermined value A is detected. Thereby, the generation of discharge short-circuiting may be accurately determined.

Incidentally, the above-described embodiment may also be modified as follows.

In the above-described embodiment, the IGBT 12 is used as the switching element for performing supply and interruption of the primary current to the primary coil 11A. However, a MOSFET, a power transistor, a thyristor and a triac may be used as the switching element.

In the embodiment, re-discharge is performed at the ignition plug 19 on condition of determining that discharge short-circuiting is occurring. Even in the case other than it is determined that discharge short-circuiting is occurring, a configuration in which re-discharge may be performed may be also adopted. This charge-discharge control is suitable to be used in an ignition system of a multiple discharge system or a continuous discharge system. Specifically, in the case of performing multiple discharge, when it is determined that discharge short-circuiting is occurring, re-discharge is performed, and when it is not determined that discharge short-circuiting is occurring, re-discharge is performed at a predetermined timing. In addition, in the case of performing continuous discharge, when it is determined that discharge short-circuiting is occurring, re-discharge is performed. The charge-discharge control is performed so that the spark discharge generated at the ignition plug 19 may be generated in a predetermined period by performing re-discharge. Even when discharge short-circuiting occurs in this configuration, the combustion state may be improved.

The discharge period is a period in which the spark discharge at the ignition plug 19 is generated. In the embodiment, even when discharge short-circuiting occurs due to performing re-discharge during the discharge period, a re-re-discharge is not performed at the ignition plug 19. However, when it is determined that discharge short-circuiting is performed by performing the re-discharge during the discharge period as a period when the spark discharge is generated at the ignition plug, the re-re-discharge may be performed at the ignition plug 19.

In the embodiment, when the primary current passing through the primary coil 11A reaches the determination value, the output of the ignition signal IGt is stopped. Thereby, supply of the primary current to the IGBT 12 via the primary coil 11A is blocked. The determination value is not necessarily used, and conduction and interruption of the primary current to the IGBT 12 may be controlled based on time. Specifically, an output period of the ignition signal IGt using the ECU 20 when the primary current passes through the primary coil 11A using the IGBT 12 for the first time during one combustion cycle is defined as an "output period A". The output period A is set as a period when the primary current may increase from 0 to the determination value. On the other hand, when re-discharge due to discharge short-circuiting is performed, the coil energy remains stored in the primary coil 11A. Accordingly, the output period of the ignition signal IGt using the driver circuit 15 is set as the period when the primary current may reach the determination value. However, the output period of the ignition signal IGt using the driver circuit 15 is shorter than the output period of the ignition signal IGt using the ECU 20. An ignition circuit unit 10 according to another example of the present example does not need to detect the primary current. Therefore, the ignition circuit unit 10 may be simplified.

In the present embodiment, until the predetermined mask time T from the time A is detected, the instantaneous fluctuation for the second time whose fluctuation amount is larger than the predetermined value is not detected. The predetermined mask time T is set to reduce erroneous determination of the occurrence of discharge short-circuiting in a period until the discharge spark is extended. The period until the discharge spark is extended varies depending on a driving state of the internal combustion engine. This is because the flow rate of the gas mixture passing through the cylinder is different according to the driving state of the internal combustion engine. Therefore, the predetermined mask time T may be set to a variable time based on the driving state of the internal combustion engine. Thereby, performing of discharge short-circuiting in a period when the discharge spark is not extended may be accurately reduced even more.

In the embodiment, after the predetermined mask time T has elapsed from the time A, discharge short-circuiting detection is performed. In this determination method of discharge short-circuiting, an implementation period of discharge short-circuiting detection may also be limited even more. This is because even if discharge short-circuiting occurs in some part of the gas mixture, which may be sufficiently heated, passing through the cylinder, it is assumed that the combustion state of the gas mixture is sufficient. In this case, there is low necessity for performing re-discharge at the ignition plug 19. Thereby, the detection of discharge short-circuiting is performed only after a predetermined determining time is elapsed from when the predetermined mask time T has elapsed from the time A has been detected. The predetermined determining time is set to a time when some part of the gas mixture is in a sufficiently heated state. Thereby, the detection of discharge short-circuiting may be performed in only a period when re-discharge needs to be performed so that wastefully performing re-discharge at the ignition plug 19 may be reduced. Furthermore, consumption of the discharge electrodes provided in the ignition plug 19 may be reduced.

In the embodiment, until the predetermined mask time T is elapsed from the time A is detected, the first instantaneous fluctuation whose fluctuation amount is larger than the predetermined value is not detected. In this point, there is no need to set the mask time T. For example, a period until a combustion process of the gas mixture is terminated from when the primary current passes through the primary coil 11A during one combustion cycle may also be set as the implementation period of the detection of discharge short-circuiting.

Figure 6:
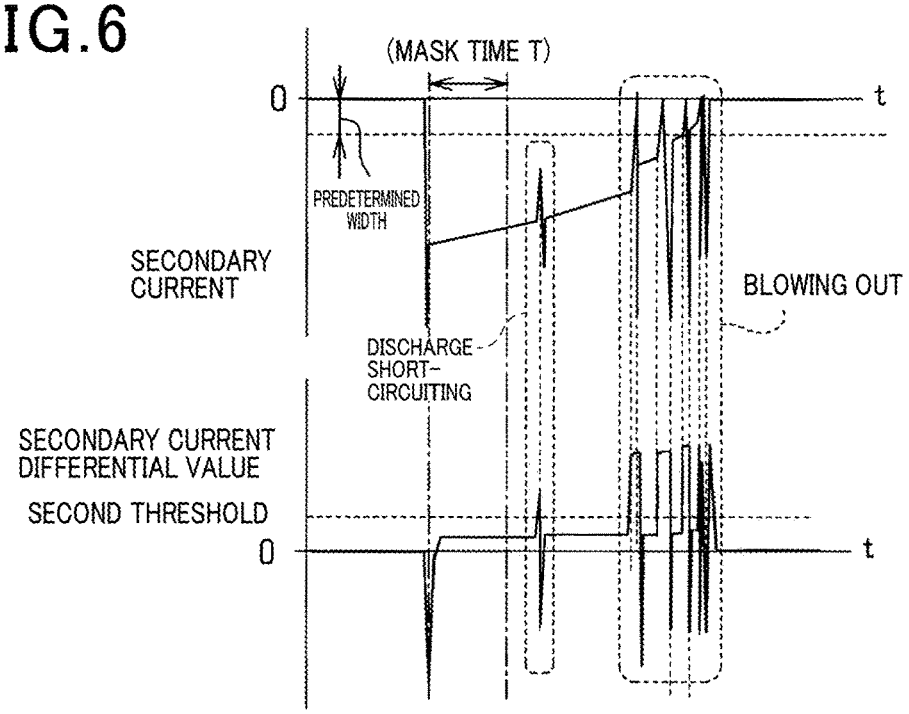
FIG. 6 shows a timing chart explaining a method of detecting the discharge short-circuiting according to the present embodiment.

In the embodiment, conduction and interruption of the primary current to the primary coil 11A are performed using the IGBT 12 for the first time during one combustion cycle. In addition, as described above, the discharge spark is generated, and the detection of discharge short-circuiting is performed subject to the instantaneous fluctuation generated of the first time or later. In this point, as shown in FIG. 6, the detection of discharge short-circuiting is performed using the predetermined value A and the second threshold. Thereby, the instantaneous fluctuation of the time A during one combustion cycle may also be subjected to the detection of discharge short-circuiting.

Figure 9:
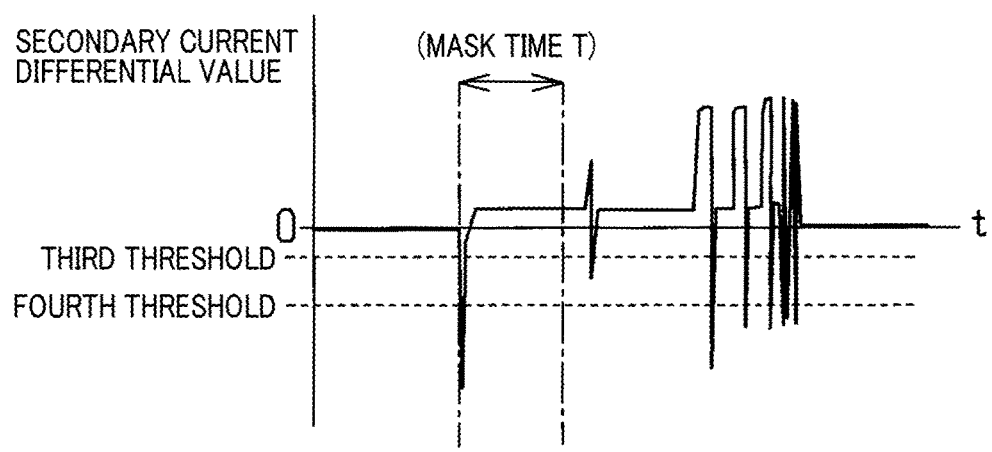
FIG. 9 shows a timing chart explaining a method of handling discharge short-circuiting according to another embodiment.

In the embodiment, the instantaneous fluctuation for the second time whose maximum value of the differential value of the secondary current is larger than the second threshold is detected. In addition, the instantaneous fluctuation for the second time minimum value of the absolute value of the secondary current is larger than the predetermined value A is also detected. In this case, it is determined that discharge short-circuiting has been generated. As described above, a value difference of the instantaneous fluctuation when re-discharge is generated is larger than that of the instantaneous fluctuation when the noise is generated. The value difference of the instantaneous fluctuation when re-discharge occurs is smaller than that of the instantaneous fluctuation when the spark discharge is generated at the ignition plug. In addition, the value difference of the instantaneous fluctuation when re-discharge is smaller than that of the instantaneous fluctuation when blowing off of the discharge spark and re-discharge occurs. Therefore, as shown in FIG. 9, an instantaneous fluctuation of a measured value whose minimum value of the differential value of the secondary current is smaller than a third threshold and is larger than a fourth threshold is detected. Thereby, it is also determined that discharge short-circuiting occurs. Thereby, the generation of discharge short-circuiting may be accurately determined.

In the embodiment, after the spark discharge is generated at the ignition plug 19 for the first time, discharge short-circuiting is not generated, and the spark discharge is stopped. In this case, the re-charge is forcibly performed at the ignition plug 19, and the second re-discharge is then performed. In this point, it may also be determined whether that re-discharge of the second time or later is performed or not. In addition, re-discharge may not be performed after the spark discharge generated at the ignition plug 19 is completely stopped. Until the predetermined time is elapsed from when the spark discharge is generated at the ignition plug 19, a configuration, which starts to perform forcibly re-discharge, may be adopted in the case that discharge short-circuiting is not generated.

The above-described other examples of the present example do not necessarily need to be performed independently, and may be performed by arbitrarily combining them.

What is claimed is:

1. An ignition control system applied to an internal combustion engine, the internal combustion engine including:
   an ignition plug which generates a spark discharge between a pair of discharge electrodes, the spark discharge ignites a combustible gas mixture in a cylinder of the internal combustion engine;
   an ignition coil including a primary coil and a secondary coil, the ignition coil applies a secondary voltage to the ignition plug using the secondary coil;
   a switching element which performs conduction and interruption of a primary current passing through the primary coil; and
   a measurement detection part which detects a measured value of a primary voltage applied to the primary coil, a secondary current passing through the ignition plug and/or a secondary voltage applied to the ignition plug,
   the ignition control system comprising:
      a primary current control part that executes a discharge generation control for generating the spark discharge to the spark plug once or a plurality of times during one combustion cycle by causing the interruption of the primary current to the switching device after performing the energization of the primary current to the primary coil; and
      a discharge short-circuiting determination part determining whether discharge short-circuiting has occurred or not based on the measured value detected from the measurement detection part, wherein,
   when the discharge short-circuiting determination part determines that the discharge short-circuiting has occurred, the primary current control part causes the discharge generation control to be executed again by causing the switching element to conduct the primary current to the primary coil, and thereafter interrupts the primary current, and
   the discharge short-circuiting determination part determines that the discharge short-circuiting has occurred during the one combustion cycle on the condition that a first instantaneous fluctuation larger than a predetermined value is detected in the measured value detected by the measurement detection part after conducting and interrupting the primary current to the primary coil by the switching element to generate the spark discharge.

2. The ignition control system as set forth in claim 1, wherein,
   the discharge short-circuiting determination part performs conduction and interruption of the primary current to the primary coil using the switching element during the one combustion cycle;
   the discharge short-circuiting determination part does not detect the first instantaneous fluctuation whose measured value detected using the measurement detection part is larger than the predetermined value until a predetermined mask time is elapsed from when the spark discharge is generated; and
   the discharge short-circuiting determination part detects the first instantaneous fluctuation whose measured value detected using the measurement detection part is larger than the predetermined value after the predetermined mask time is elapsed from when the spark discharge is generated.

3. The ignition control system as set forth in claim 2, wherein,
   the mask time may be set based on a driving state of the internal combustion engine.

4. The ignition control system as set forth in claim 2, wherein,
   the discharge short-circuiting determination part detects the first instantaneous fluctuation of the measured value detected using the measurement detection part only during a period from the predetermined mask time has elapsed to a predetermined determination time has elapsed.

5. The ignition control system as set forth in claim 1, wherein,
   the primary current control part makes the switching element pass the primary current through the primary coil when the discharge short-circuiting determination part determines that discharge short-circuiting has occurred; and
   the primary current control part makes the switching element block the primary current to the primary coil when the primary current reaches a determination value.

6. The ignition control system as set forth in claim 1, wherein,
   the discharge generation control is executed again by making the primary current control part to make the switching element to block the primary current flowing to the primary coil after making the switching element to pass the primary current through the primary coil on condition that the discharge short-circuiting determination part determines that discharge short-circuiting has occurred.

7. The ignition control system as set forth in claim 1, wherein,
   the measurement detection part detects the secondary current passing through the ignition plug as the measured value; and
   the discharge short-circuiting determination part determines that discharge short-circuiting has occurred on conditions that a minimum value of an absolute value of the secondary current of the measured value detected using the measurement detection part is larger than a first threshold and an instantaneous fluctuation whose maximum value of a differential value of the measured value is larger than a second threshold is detected.

8. The ignition control system as set forth in claim 1, wherein,
   the measurement detection part detects the secondary current passing through the ignition plug as the measured value; and
   the discharge short-circuiting determination part determines that discharge short-circuiting has occurred on condition that an instantaneous fluctuation whose minimum value of the differential value of the measured value is smaller than a threshold and is larger than another threshold has been detected by the measurement detection part.

9. An ignition control system applied to an internal combustion engine, the internal combustion engine including:
- a plurality of ignition plugs each of which has a pair of discharge electrodes between which a spark discharge is generated, the spark discharge ignites a combustible gas mixture in a plurality of cylinders of the internal combustion engine;
- an ignition coil including a primary coil and a secondary coil, the ignition coil applies a secondary voltage to the ignition plug using the secondary coil;
- a switching element which performs conduction and interruption of a primary current passing through the primary coil; and
- a measurement detection part which detects a measured value of a primary voltage applied to the primary coil, a secondary current passing through the ignition plug and/or a secondary voltage applied to the ignition plug, the ignition control system comprising:
    - a primary current control part that executes a discharge generation control for generating the spark discharge to the spark plug once or a plurality of times during one combustion cycle by causing the interruption of the primary current to the switching device after performing the energization of the primary current to the primary coil; and
    - a discharge short-circuiting determination part determining whether discharge short-circuiting has occurred or not based on the measured value detected from the measurement detection part, wherein when the discharge short-circuiting determination part determines that the discharge short-circuiting has occurred, the primary current control part causes the discharge generation control to be executed again by causing the switching element to conduct the primary current to the primary coil, and thereafter interrupts the primary current, and the discharge short-circuiting determination part determines that the discharge short-circuiting has occurred during the one combustion cycle on the condition that a first instantaneous fluctuation larger than a predetermined value is detected in the measured value detected by the measurement detection part after conducting and interrupting the primary current to the primary coil by the switching element to generate the spark discharge.

* * * * *